(12) United States Patent
Lauermann et al.

(10) Patent No.: US 11,031,519 B2
(45) Date of Patent: Jun. 8, 2021

(54) LIGHT RECEIVING UNIT

(71) Applicant: AZUR SPACE Solar Power GmbH, Heilbronn (DE)

(72) Inventors: Thomas Lauermann, Neuenstein (DE); Christoph Peper, Hannover (DE); Wolfgang Koestler, Heilbronn (DE)

(73) Assignee: AZUR SPACE Solar Power GmbH, Heilbronn (DE)

( * ) Notice: Subject to any disclaimer, the term of this patent is extended or adjusted under 35 U.S.C. 154(b) by 21 days.

(21) Appl. No.: 16/673,160

(22) Filed: Nov. 4, 2019

(65) Prior Publication Data

US 2020/0066932 A1  Feb. 27, 2020

Related U.S. Application Data

(63) Continuation of application No. PCT/EP2018/000092, filed on Mar. 8, 2018.

(30) Foreign Application Priority Data

May 2, 2017 (DE) .................. 10 2017 004 149.0

(51) Int. Cl.
*H01L 31/167* (2006.01)
*H01L 31/0304* (2006.01)
(Continued)

(52) U.S. Cl.
CPC ........ *H01L 31/167* (2013.01); *H01L 31/0304* (2013.01); *H01L 31/102* (2013.01); *H01L 31/1136* (2013.01); *H03K 19/14* (2013.01)

(58) Field of Classification Search
CPC . H01L 31/167; H01L 31/0304; H01L 31/102; H01L 31/1136; H03K 19/14
See application file for complete search history.

(56) References Cited

U.S. PATENT DOCUMENTS 3,818,451 A    6/1974 Coleman
4,127,862 A   11/1978 Ilegems et al.
(Continued)

FOREIGN PATENT DOCUMENTS

DE           69421884 T2    5/2000
DE         102010001420 A1   8/2011
(Continued)

OTHER PUBLICATIONS

Campbell et al., "Optical and Gate", IEEE J. Quantum Electron., QE-18, 992 (1982) (Year: 1982).*

(Continued)

*Primary Examiner* — Sitaramarao S Yechuri
(74) *Attorney, Agent, or Firm* — Muncy, Geissler, Olds & Lowe, P.C.

(57) ABSTRACT

A light receiving unit having a first energy source made up of two sub sources. A first terminal contact is formed at the upper face of the first sub source and a second terminal contact is formed at the lower face of the second sub source. The sub source has at least one semiconductor diode that has an absorption edge adapted to a first wavelength of light and the second semiconductor diode has an absorption edge adapted to a second wavelength of light which is different from the first wavelength of light, such that the first sub source generates electric voltage upon being irradiated with the first wavelength of light and the second sub source generates electric voltage upon being irradiated with the second wavelength of light.

13 Claims, 3 Drawing Sheets

(51) Int. Cl.
*H01L 31/102* (2006.01)
*H01L 31/113* (2006.01)
*H03K 19/14* (2006.01)

(56) References Cited

U.S. PATENT DOCUMENTS

| | | | |
|---|---|---|---|
| 4,689,793 A * | 8/1987 | Liu | H01S 5/06209 |
| | | | 250/214 LS |
| 4,996,577 A | 2/1991 | Kinzer | |
| 5,113,076 A * | 5/1992 | Schulte | H01L 27/1446 |
| | | | 250/330 |
| 5,389,776 A * | 2/1995 | Woodward | H03K 17/785 |
| | | | 250/214 LS |
| 5,514,875 A | 5/1996 | Krause | |
| 5,731,621 A * | 3/1998 | Kosai | B82Y 20/00 |
| | | | 250/338.4 |
| 6,043,550 A | 3/2000 | Kuhara et al. | |
| 6,239,354 B1 | 5/2001 | Wanlass | |
| 8,350,208 B1 * | 1/2013 | Zhang | H01L 27/14647 |
| | | | 250/214.1 |
| 8,809,877 B2 | 8/2014 | Guo | |
| 9,972,735 B2 | 5/2018 | Guter et al. | |
| 2006/0048811 A1 | 3/2006 | Krut et al. | |
| 2007/0080284 A1 * | 4/2007 | Wipiejewski | H01L 31/1085 |
| | | | 250/214.1 |
| 2007/0298845 A1 * | 12/2007 | Knoedgen | G01J 1/44 |
| | | | 455/569.1 |
| 2018/0020175 A1 * | 1/2018 | Nayar | H01L 27/14643 |
| 2018/0241478 A1 | 8/2018 | Guter et al. | |
| 2018/0374982 A1 * | 12/2018 | Koestler | H01L 31/1013 |

FOREIGN PATENT DOCUMENTS

| | | |
|---|---|---|
| DE | 102016001388 A1 | 8/2017 |
| EP | 2310053 A1 | 9/1973 |
| EP | 3104422 A1 | 12/2016 |
| WO | WO2013067969 A1 | 5/2013 |
| WO | WO2017067632 A1 | 4/2017 |

OTHER PUBLICATIONS

Kalkhoran et al, "Cobald disilicide intercell ohmic contacts for multijunction photovoltaic energy converters", Appl. Phys. Lett 64 (15). Apr. 11, 1994, pp. 1980-1982.

Bett et al, "III-V Solar Cells under Monochromatic Illumination", Photovoltaic Specialists Conference, 2008, ISBN 978-1-4244-1641-7/08/ 2008 33$^{rd}$ IEEE, pp. 1-5.

Kazutoshi et al, "A Rapid Optoelectronic Half-Adder Logic composed of a air of gaas Metal-Semiconductor-Metal Photodetectors", IEEE Journal of Quantam Electronics, Apr. 1990, pp. 619-621.

\* cited by examiner

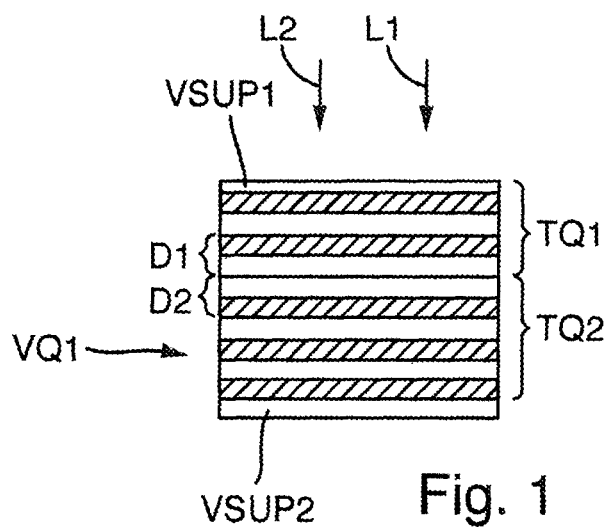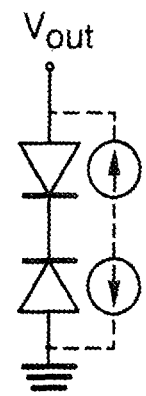
Fig. 1          Fig. 2
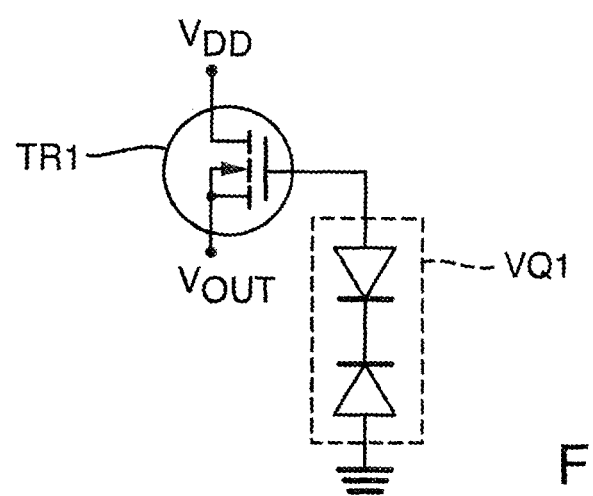
Fig. 3

| SD1 | SD2 | TR1 | TR2 | S$_{OUT}$ |
|---|---|---|---|---|
| 0 | 0 | 0 | 0 | 0 |
| 1 | 0 | 1 | 0 | 1 |
| 0 | 1 | 0 | 1 | 1 |
| 1 | 1 | 0 | 0 | 0 |
| | | | | XOR |

Fig. 6

LIGHT RECEIVING UNIT

This nonprovisional application is a continuation of International Application No. PCT/EP2018/000092, which was filed on Mar. 8, 2018, and which claims priority to German Patent Application No. 10 2017 004 149.0, which was filed in Germany on May 2, 2017, and which are both herein incorporated by reference.

BACKGROUND OF THE INVENTION

Field of the Invention

The present invention relates to a light receiving unit and an optocoupler including a light receiving unit.

Description of the Background Art

Light receiving units are well known. In an optocoupler, a light receiving unit is combined with a transmitting unit, wherein the two units are electrically isolated, yet optically coupled. Such components are known from U.S. Pat. No. 4,996,577. Also, optical components are known from US 2006/0048811 A1, U.S. Pat. No. 8,350,208 and WO 2013/067969 A1.

DE 2 310 053 A1, which corresponds to U.S. Pat. No. 3,818,451, describes a field of light emitting elements and of light receiving elements as a light receiving unit in a logical arrangement. A light receiving unit with two receiving diodes is known from the German patent application No. 10 2016 001 388.5.

Further light receiving units with a plurality of semiconductor diodes are known from U.S. Pat. Nos. 6,043,550, 5,113,076, WO 2017/067632 A1, EP 3 104 422 A1. From "A Rapid Optoelectronic Half-Adder Logic Composed of a Pair of GaAs Metal-Semiconductor-Metal Photodetectors", Kazutoshi Nakajima et al., IEEE Journal of Quantum Electronics, IEEE Service Center Piscataway, N.J., Vol. 26, No. 4, April 1990, pages 619-621, XP000149712, ISSN: 0018-9197, DOI: 10.1109/3.53375, a logic gate with two photodetectors is known.

From U.S. Pat. Nos. 4,127,862, 6,239,354, DE 10 2010 001 420 A1, Nader M. Kalkhoran, et al, "Cobalt disilicide intercell ohmic contacts for multijunction photovoltaic energy converters", Appl. Phys. Lett. 64, 1980 (1994) and from A. Bett et al, "III-V Solar cells under monochromatic illumination", Photovoltaic Specialists Conference, 2008, PVSC '08, 33rd IEEE, page 1-5, ISBN: 978-1-4244-1640-0, scalable voltage sources or solar cells made of III-V materials are known.

SUMMARY OF THE INVENTION

It is therefore an object of the present invention to provide a device which further develops the prior art.

According to an exemplary embodiment of the invention, a light receiving unit comprises a first energy source.

The first energy source has two sub sources each of which is formed as a current source or as a voltage source. A first terminal contact is formed at the upper face of the first sub source and a second terminal contact is formed at the lower face of the second sub source.

The first sub source can have at least one first semiconductor diode and the second sub source can have at least one second semiconductor diode.

The first semiconductor diode can have an absorption edge adapted to a first wavelength of light, and the second semiconductor diode can have an absorption edge adapted to a second wavelength of light, so that the first sub source generates an electric voltage upon being irradiated with the first wavelength of light and the second sub source generates an electric voltage upon being irradiated with the second wavelength of light.

The first wavelength of light differs from the second wavelength of light by a differential wavelength.

The first semiconductor diode can be connected in series, i.e., connected antiserially, so as to have the opposite polarization of the polarization of the second semiconductor diode, such that the voltages generated by the first semiconductor diode and those generated by the second semiconductor diode at least partly compensate for each other.

It should be noted that the term wavelength of light, in particular referred to the light of an LED, stands for the central wavelength of a generally Gaussian shaped spectrum which, for example in a typical 850 nm LED, has a half width of 20-30 nm.

It should also be understood that the photon energy corresponding to the wavelength of light is slightly larger than or equal to the band gap energy of the absorption layers of the semiconductor diodes.

It should also be noted that the difference, i.e., the differential wavelength between the first wavelength of light and the second wavelength of light is at least 40 nm.

It should also be noted that unlike the prior art, source voltages of the individual sub sources greater than 2V, or from 2V to 5V, can be advantageously generated by using the present stacked approach.

It was found that by connecting several semiconductor diodes in series to a sub source, the source voltages of the semiconductor diodes add up at first approximation. For example, the number N of the series-connected semiconductor diodes can be less than ten.

An advantage of the device according to the invention is that the opposite polarity of the series-connected sub sources allows for a particularly simple and reliable XOR connective, i.e., an exclusive OR by means of two optical signals, namely the first and the second wavelengths L1 and L2, to be replicated.

The receiving unit in this case has only two electrical connections. A further advantage is that due to the stacked arrangement of the semiconductor diodes, a considerable amount of space is saved, and a compact design is possible as compared with the previous lateral arrangement with silicon diodes. An XOR connective is particularly suitable for protection circuits for power transistors.

Each sub source can have a plurality of semiconductor layers, wherein the semiconductor layers can be arranged in a stack-like manner for each sub source, and each sub source can have an upper face and a lower face.

The lower face of the first sub source can be arranged on the upper face of the second sub source.

The first sub source or partial voltage source and the second sub source or partial voltage source can be monolithically integrated, so that the two sub sources form a common stack with a front side and a rear side.

The entire upper face of the stack can be irradiated with light of the first wavelength of light and/or with light of the second wavelength of light.

The light receiving unit can have a first depletion-type transistor, wherein the first terminal contact of the first energy source is connected to the gate terminal of the first transistor and the second terminal contact of the first energy source is connected to the source terminal of the first transistor.

The light receiving unit can have a second energy source, wherein the second energy source is formed substantially identical to that of the first energy source.

An electrically insulating barrier can be arranged between the first energy source and the second energy source.

The light receiving unit can have a first depletion-type transistor and a second depletion-type transistor, wherein the first transistor can be embodied as an n-channel transistor and the second transistor can be embodied as a p-channel transistor.

The first terminal contact of the first energy source can be connected to the gate terminal of the first transistor and the second terminal contact of the first energy source can be connected to the source terminal of the first transistor.

The first terminal contact of the second energy source can be connected to the gate terminal of the second transistor and the second terminal contact of the second energy source can be connected to the source terminal of the second transistor.

A current distribution layer can be arranged between the first sub source and the second sub source.

The first sub source and/or the second sub source comprises or consists of a compound semiconductor from the substance group of III-arsenide or III-phosphides.

The first sub source and the second sub source comprises a GaAs compound or consists of a GaAs compound.

An inventive optocoupler includes a light receiving unit of the type described above and a transmitting unit, wherein the transmitting unit and the receiving unit are isolated from each other and optically coupled with one another and integrated in a common housing.

The transmitting unit comprises at least a first transmitting diode with the first wavelength of light and a second transmitting diode with the second wavelength of light.

It is understood that if the photon emission in the transmitter module is subject to modulation, the modulation will cause a modulated voltage, i.e., in other words, the magnitude of the energy produced varies with time.

It is also understood that the term in a common housing in particular refers to a single housing, i.e., the receiving unit and the receiving unit have no housing of their own.

It is understood that a housing can be a potting housing. Such housings are produced by means of a so-called molding process.

In a stacked configuration of the sub sources of the light receiving unit, only a small reception surface, namely the upper face of the stack of the light receiving unit, needs to be illuminated by the transmitter diode or the light source.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein:

FIG. 1 is a view of an exemplary embodiment of a light receiving unit according to the invention, FIG. 2 is a view of a circuit diagram with an equivalent circuit diagram of the light receiving unit, FIG. 3 is a view of an exemplary embodiment of a light receiving unit according to the invention, FIG. 6 is a chart showing the switching behavior.

DETAILED DESCRIPTION

Figure 4:
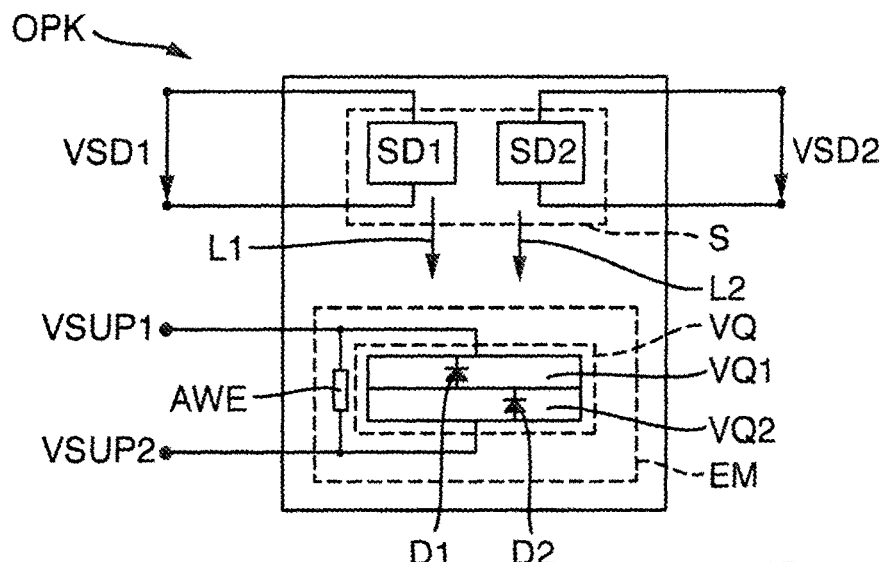
FIG. 4 is a view of an optocoupler according to the invention.

The illustration of FIG. 1 shows an exemplary embodiment of a light receiving unit EM of a monolithic construction.

The light receiving unit has a first energy source VQ1, formed of a first sub source TQ1 and a second sub source TQ2, wherein the first energy source VQ1 is designed as a current source or as a voltage source.

Each of the two sub sources TQ1, TQ2 has a plurality of semiconductor layers, wherein the semiconductor layers for each sub source TQ1, TQ2 are arranged stacked and formed of a GaAs compound.

The semiconductor layers form diodes, so that the first sub source TQ1 at least comprises a first semiconductor diode D1 and the second sub source at least comprises a second semiconductor diode D2.

The first sub source TQ1 is arranged on the second sub source TQ2. Both sub sources TQ1 and TQ2 form a single stack and are monolithically integrated and interconnected in series, wherein the first diode D1 of the first sub source TQ1 and the second diode D2 of the second sub source TQ2 are arranged of opposite polarity to each other and are electrically connected.

A first terminal VSUP1 is arranged on an upper face of the sub source TQ1 and a second terminal VSUP2 is arranged on a lower face of the second sub source TQ2 as a flat contact layer.

The at least one first semiconductor diode D1 has an absorption edge adapted to a first wavelength of light L1 and the at least one second semiconductor diode D2 has an absorption edge adapted to a second wavelength of light L2, so that the first sub source TQ1 generates electric voltage upon being irradiated with the first wavelength of light L1 and the second sub source TQ2 generates electric voltage upon being irradiated with the second wavelength of light L2.

The first wavelength of light L1 differs from the second wavelength of light L2 by a differential wavelength D, wherein the differential wavelength is at least 40 nm.

Incident light always first strikes the upper face of the first energy source VQ1, in this case the upper face of the first sub source TQ1. Subsequently, it passes through the first sub source TQ1 and the second sub source TQ2. It is understood that the first sub source TQ1 has a larger band gap than the second sub source TQ2.

Due to the opposite polarity of the semiconductor diodes D1 and D2 of the two sub sources TQ1 and TQ2, the voltages generated have opposite signs, that is, when the light receiving unit is irradiated simultaneously with light of the first wavelength of light L1 and light of the second wavelength of light L2, the voltages at least partly compensate for each other.

While the shorter wavelength in the first sub source TQ1 produces a positive voltage, a negative voltage is generated by the longer wavelength in the second sub source TQ2. If the voltages are equal in respect of magnitude, then with the concurrent incidence of light of the first and second wavelength of light L1 and L2, the voltage generated by the light receiving unit EM equals substantially or exactly zero.

In a Boolean representation, the current behavior between the two terminals VSUP1 and VSUP2 corresponds to an XOR connective. If light with only one of the two wavelengths of light L1 or L2 strikes the receiving unit EM, then depending on the wavelength between the two terminals VSUP1 and VSUP2, a positive or negative voltage is measured.

If the light of the wavelengths L1 and L2 is simultaneously incident, then the voltages generated by the diodes D1 and D2 at least partly or almost completely compensate for each other, so that an at least lower negative or positive voltage or a much lower or nearly zero voltage is reached between the two terminals VSUP1 and VSUP2. If no light having a wavelength of light L1 or L2 is incident, then the voltage reached between the two terminals VSUP1 and VSUP2 equals at least approximately zero, since none of the diodes D1 or D2 generate any relevant voltage.

The illustration of FIG. 2 shows a schematic circuit diagram of the equivalent circuit diagram of a light receiving unit EM. The second terminal VSUP2 is grounded; an output signal Vout is tapped at the first terminal VSUP1. Preferably, the diodes act as a voltage source.

The illustration of FIG. 3 shows a schematic view of a further embodiment of a light receiving unit EM according to the invention. Below, only the differences to FIGS. 1 and 2 are explained.

The light receiving unit EM has a depletion-type first transistor TR1, wherein the second terminal VSUP1 of the first energy source VQ1 is grounded and the second terminal VSUP2 is connected to the gate terminal G of the first transistor TR1.

At the drain terminal D of the first transistor TR1 is a supply voltage VDD and at the source terminal S of the transistor, the output signal Vout is tapped.

The first energy source switches the transistor TR1 so that the output signal Vout forms an XOR connective with respect to the incidence of light of the wavelengths L1 and L2.

The illustration of FIG. 4 shows an exemplary embodiment of an inventive optocoupler OPK with a light receiving unit EM of the type described above and a transmitting unit S. In the following, only the differences to the figure of FIG. 1 will be explained.

It should be understood that the optocoupler OPK is housed, i.e., the components mentioned are integrated in the common housing. If transmitting unit S emits a modulated photon current, the voltage and the current is also modulated in the light receiving unit EM.

The transmitting unit S comprises a first transmitting diode SD1 and a second transmitting diode SD2, which can be, for example, formed of at least on light emitting diode. The first transmitting diode SD1 has the first wavelength of light L1 that is adapted to the at least one first diode D1 of the light receiving unit EM.

The second transmitting diode SD2 has the second wavelength of light L2 that is adapted to the at least one second diode D2 of the light receiving unit EM. The first transmitting diode SD1 has two terminal contacts, wherein a first supply voltage VDS1 is applied to the two terminal contacts.

The second transmitting diode SD2 also has two terminal contacts, wherein a second supply voltage is applied at the two terminal contacts VDS2.

The light receiving unit EM has an evaluation unit AWE, which is connected in parallel to the first energy source VQ1.

Figure 5:
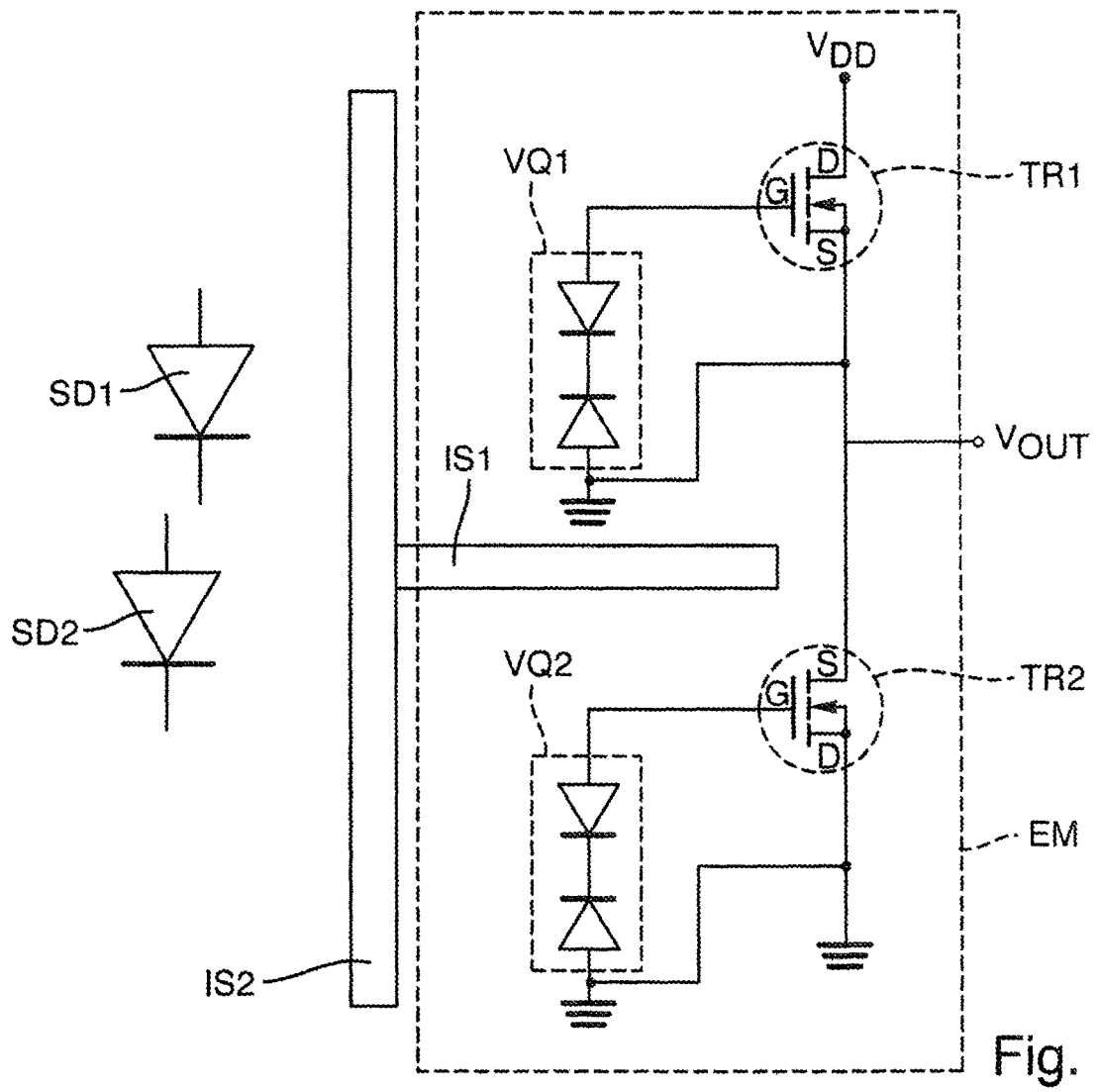
FIG. 5 is a view of an optocoupler according to the invention.

FIG. 5 shows an exemplary embodiment of an advantageous development of an optocoupler OPK according to the invention. In the following, only the differences to the illustration of FIGS. 3 and 4 will be explained.

In addition to the first energy source VQ1, the receiving unit EM comprises a second energy source VQ2, wherein the second energy source VQ2 and the first energy source VQ1 are identical in design.

Between the first energy source VQ1 and the second energy source VQ2, a non-electrically conductive first insulator IS1 is arranged. The receiving unit EM is separated from the two transmitting diodes SD1 and SD2 by means of a non-electrically conductive, optically transparent second insulator IS2.

In accordance with the exemplary embodiment shown in FIG. 3, the energy sources VQ1 and VQ2 are connected to a first depletion-type transistor TR1 and a second depletion-type transistor TR2, wherein the first transistor TR1 is an n-channel transistor and the second transistor TR2 is a p-channel transistor.

The supply voltage VDD is applied to the drain terminal D of the first transistor TR1, the drain terminal D of the second transistor TR2 is grounded and the source terminals S of the two transistors TR1 and TR2 are short-circuited. The output signal Vout is tapped between the source terminals S of the two transistors TR1 and TR2.

The incidence of light of only the first transmitting diode SD1 in each case generates positive voltage in the first diodes D1 of the two energy sources VQ1 and VQ2, whereby the n-channel transistor TR1 conducts while the p-channel transistor blocks. The output signal Vout corresponds to the supply voltage VDD.

If only light from the second transmitting diode SD2 is incident, then the second diodes D2 of the two energy sources VQ1 and VQ2 each generate a negative voltage.

The n-channel transistor TR1 blocks while the p-channel transistor TR2 conducts. The output signal corresponds to the negative voltage generated in the second diode D2 of the second energy source VQ2.

If light from the first and second transmitting diode SD1 and SD2 are simultaneously incident, then the voltages generated in the first diodes D1 and the second diodes D2 of the two energy sources VQ1 and VQ2 respectively compensate for each other such that both transistors TR1 and TR2 block and the output signal Vout is zero.

The table of FIG. 6 shows the relationship between the light incident of the light of the two transmitting diodes SD1 and SD2, the switching state of the two transistors TR1 and TR2 and a switching signal Sout obtained from the output signal Vout.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:
1. A light receiving unit comprising:
a first energy source, the first energy source comprising a first and a second sub source formed as a current source or a voltage source, the first energy source only having a first electric terminal contact and a second electric terminal contact, the first terminal contact being formed on an upper face of the first sub source and the second terminal contact being formed on a lower face of the second sub source;

at least one first semiconductor diode provided in the first sub source; and at least one second semiconductor diode provided in the second sub source, wherein the first semiconductor diode has an absorption edge adapted to a first wavelength of light and the second semiconductor diode has an absorption edge adapted to a second wavelength of light so that the first sub source generates an electric voltage upon being irradiated with the first wavelength of light and the second sub source generates an electric voltage upon being irradiated with the second wavelength of light, wherein the first wavelength of light differs from the second wavelength of light by a differential wavelength, wherein the first semiconductor diode is connected in series with the second semiconductor diode so that a polarization of the first semiconductor diode is opposite to a polarization of the second semiconductor diode, such that the voltage generated by the first semiconductor diode and the second semiconductor diode at least partly compensate for each other, and wherein a current distribution layer is arranged between the first sub source and the second sub voltage source.

2. The light receiving unit according to claim 1, wherein the first and second sub sources have a plurality of semiconductor layers, the semiconductor layers for each of the first and second sub sources being arranged in a stacked manner, each of the first and second sub sources having an upper face and a lower face, and wherein the lower face of the first sub source is arranged on the upper face of the second sub source, and wherein the first sub source and the second sub source are monolithically integrated so that the first and second sub sources form a common stack with a front side and a rear side.

3. The light receiving unit according to claim 1, wherein the light receiving unit has a first depletion-type transistor, wherein the first terminal contact of the first energy source is connected to a gate terminal of the first transistor and the second terminal contact of the first energy source is connected to the source terminal of the first transistor.

4. The light receiving unit according to claim 1, wherein the light receiving unit has a second energy source, and wherein the second energy source is substantially identical in design to that of the first energy source.

5. The light receiving unit according to claim 4, wherein the light receiving unit has a first depletion-type transistor and a second depletion-type transistor, wherein the first transistor is an n-channel transistor and the second transistor is a p-channel transistor, wherein the first terminal contact of the first energy source is connected to a gate terminal of the first transistor, and wherein the second terminal contact of the first energy source is connected to a source terminal of the first transistor, and wherein the first terminal contact of the second energy source is connected to a gate terminal of the second transistor and the second terminal contact of the second energy source is connected to a source terminal of the second transistor.

6. The light receiving unit according to claim 1, wherein the first sub source and/or the second sub source comprises a compound semiconductor from the substance group of III-arsenide or III-phosphides, or wherein the first sub source and/or the second sub source comprises a GaAs compound.

7. The light receiving unit according to claim 1, wherein the polarization of the first semiconductor diode being opposite to the polarization of the second semiconductor diode forms a XOR connective.

8. The light receiving unit according to claim 1, wherein the first semiconductor diode and the second semiconductor diode act as a voltage source.

9. A light receiving unit comprising:

a first energy source, the first energy source comprising a first and a second sub source formed as a current source or a voltage source, the first energy source having a first electric terminal contact and a second electric terminal contact, the first terminal contact being formed on an upper face of the first sub source and the second terminal contact being formed on a lower face of the second sub source;

a second energy source;

at least one first semiconductor diode provided in the first sub source; and at least one second semiconductor diode provided in the second sub source, wherein the first semiconductor diode has an absorption edge adapted to a first wavelength of light and the second semiconductor diode has an absorption edge adapted to a second wavelength of light so that the first sub source generates an electric voltage upon being irradiated with the first wavelength of light and the second sub source generates an electric voltage upon being irradiated with the second wavelength of light, wherein the first wavelength of light differs from the second wavelength of light by a differential wavelength, wherein the first semiconductor diode is connected in series with the second semiconductor diode so that a polarization of the first semiconductor diode is opposite to a polarization of the second semiconductor diode, such that the voltage generated by the first semiconductor diode and the second semiconductor diode at least partly compensate for each other, and wherein an electrically insulating barrier is arranged between the first energy source and the second energy source.

10. The light receiving unit according to claim 9, wherein a current distribution layer is arranged between the first sub source and the second sub voltage source.

11. An optocoupler comprising:

a light receiving unit comprising:

a first energy source, the first enemy source comprising a first and a second sub source formed as a current source or a voltage source, the first energy source having a first electric terminal contact and a second electric terminal contact, the first terminal contact being formed on an upper face of the first sub source and the second terminal contact being formed on a lower face of the second sub source;

at least one first semiconductor diode provided in the first sub source; and at least one second semiconductor diode provided in the second sub source, wherein the first semiconductor diode has an absorption edge adapted to a first wavelength of light and the second semiconductor diode has an absorption edge adapted to a second wavelength of light so that the first sub source generates an electric voltage upon being irradiated with the first wavelength of light and the second sub source generates an electric voltage upon being irradiated with the second wavelength of light, wherein the first wavelength of light differs from the second wavelength of light by a differential wavelength, wherein the first semiconductor diode is connected in series with the second semiconductor diode so that a polarization of the first semiconductor diode is opposite to a polarization of the second semiconductor diode, such that the voltage generated by the first semiconductor diode and the second semiconductor diode at least partly compensate for each other; and a transmitting unit, wherein the light receiving unit and the transmitting unit are isolated from one another and optically coupled to one another and integrated in a common housing, and wherein the transmitting unit has at least a first transmitting diode corresponding with a first wavelength of light and a second transmitting diode corresponding with a second wavelength of light.

12. The optocoupler according to claim 11, wherein the first transmitting diode or the second transmitting diode is a light emitting diode.

13. The optocoupler according to claim 11, wherein an evaluation unit is connected in parallel with the first energy source.

* * * * *